US008335123B2

(12) United States Patent
Sprouse

(10) Patent No.: US 8,335,123 B2
(45) Date of Patent: Dec. 18, 2012

(54) POWER MANAGEMENT OF MEMORY SYSTEMS

(75) Inventor: Steven Theodore Sprouse, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 406 days.

(21) Appl. No.: 12/623,291

(22) Filed: Nov. 20, 2009

(65) Prior Publication Data

US 2011/0122691 A1 May 26, 2011

(51) Int. Cl.
*G11C 5/14* (2006.01)
*G11C 16/04* (2006.01)

(52) U.S. Cl. .............. 365/226; 365/185.03; 365/185.17; 713/300

(58) Field of Classification Search ............. 365/185.03, 365/226, 185.17; 711/167; 713/300
See application file for complete search history.

(56) References Cited

U.S. PATENT DOCUMENTS

| 5,845,142 | A | 12/1998 | Hayasaka |
| 7,159,082 | B1 * | 1/2007 | Wade ............................ 711/155 |
| 7,370,168 | B2 * | 5/2008 | Kanamori et al. ............ 711/167 |
| 7,818,592 | B2 * | 10/2010 | Meier et al. .................... 713/300 |
| 2003/0217295 | A1 | 11/2003 | Sadowski |
| 2005/0071701 | A1 | 3/2005 | Luick |
| 2007/0211551 | A1 | 9/2007 | Yogev et al. |
| 2008/0095053 | A1 | 4/2008 | Chen et al. |
| 2008/0178019 | A1 | 7/2008 | Mcgrane et al. |
| 2008/0263373 | A1 | 10/2008 | Meier et al. |
| 2009/0024863 | A1 | 1/2009 | Karstens |
| 2011/0078496 | A1 * | 3/2011 | Jeddeloh ...................... 714/6.24 |

FOREIGN PATENT DOCUMENTS

| EP | 1486876 | 12/2004 |
| WO | WO03/029951 | 4/2003 |
| WO | WO 2011063016 | 5/2011 |

OTHER PUBLICATIONS

Banerjee, Nilanjan et al. "Triage: Balancing Energy and Quality of Service in a Microserver," *MobiSys '07*, Jun. 11-13, 2007, San Juan, USA. (13 pgs).
Basic Patentability Search Results: SSD-1383 Aug. 19, 2009. SanDisk Corporation.
International Search Report and Written Opinion dated Apr. 6, 2011 issued in PCT/US2010/057072.
International Preliminary Report on Patentability dated May 22, 2012 issued in PCT/US2010/057072.

* cited by examiner

*Primary Examiner* — Hoai V Ho
*Assistant Examiner* — Tri Hoang
(74) *Attorney, Agent, or Firm* — Weaver Austin Villeneuve & Sampson, LLP

(57) ABSTRACT

A memory system that includes a memory array and a memory controller manages power consumption by maintaining a variable credit value that reflects the amount of power available to the memory system. The variable credit value may be increased periodically up to a limit. When a power-consuming operation is performed, the variable credit value is reduced to reflect the power used.

22 Claims, 5 Drawing Sheets

POWER MANAGEMENT OF MEMORY SYSTEMS

BACKGROUND OF THE INVENTION

This invention relates to memory systems and to systems and methods for power management within such memory systems.

Nonvolatile memory systems are used in various applications. Some nonvolatile memory systems are embedded in a larger system such as a personal computer, cell phone, or music player. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

An individual memory cell may hold one bit of data in what is known as a Single Level Cell (SLC) design. In some examples, a memory cell may hold two or more bits of data in what is known as a Multi Level Cell (MLC) design. Memory cells may be arranged in different ways. One common arrangement is in strings of memory cells that form a NAND memory array.

SUMMARY OF THE INVENTION

A method of managing a memory system according to one example includes: maintaining a variable credit value in a memory controller, the variable credit value reflecting an amount of power available for memory operations in the memory system, the variable credit value having an upper limit that reflects a maximum power limit for the memory system; prior to performing a memory operation, checking that the variable credit value indicates that there is sufficient power available to perform the memory operation; and updating the variable credit value to reflect the power used in performing the memory operation.

A method may further include checking if the variable credit value indicates that there is sufficient power available to perform at least a part of an additional memory operation, and if there is sufficient power to perform at least a part of an additional memory operation, then determining a degree of parallelism to use in performing the memory operation and the additional memory operation. The memory operation may be programming a first page in a first memory die and the additional memory operation may be programming a second page in a second memory die. The first die may be on a first memory chip and the second die may be on a second memory chip. The first page may be a lower page and the second page may be an upper page. The variable credit value may be maintained as a number of tokens in a token bucket, with tokens periodically added to the token bucket to increase the number of tokens up to a maximum number. The tokens may be added at a rate that depends on a power mode of a host device. The tokens may be added at a lower rate when the host device is operating on battery power, and the tokens may be added at a higher rate when the host device is operating on external power. The token bucket may be provided as an n-bit counter. The maximum number may be determined by a maximum power available to the memory system through an interface. The variable credit value may be maintained as a number of tokens in a token bucket, with tokens added to the token bucket in bursts.

A method of managing power use in a memory system according to an example includes: initiating a token bucket to contain a number of tokens equal to an initial value at an initial time; subsequently performing a memory write operation, the memory write operation associated with a predetermined number of tokens; subtracting the predetermined number from the number of tokens contained in the token bucket so that the token bucket contains an updated number of tokens; and subsequently managing an additional memory write operation according to the updated number of tokens.

A method of managing power use in a memory system may also include: adding tokens to the token bucket in a predetermined pattern. The memory system may be a memory card with a host interface according to a memory card standard. The initial value may be determined by a maximum power limit of the memory card standard. The predetermined pattern may be determined by the memory card standard. The memory system may include NAND flash memory with multi level cells.

A removable nonvolatile memory card according to an example includes: a memory array that contains a plurality of nonvolatile memory cells; and a memory controller that maintains a token bucket, the token bucket containing a number of tokens, the memory controller incrementing the number of tokens in the token bucket periodically, up to a limit, the memory controller using the number of tokens in the token bucket at a given time to determine whether a write operation can be performed in the memory array.

The memory controller may be a central memory controller, and the memory card may include a plurality of peripheral memory controllers, each peripheral memory controller managing data in at least one memory chip of the memory array according to the number of tokens in the token bucket. A memory card may also include an additional memory array and an additional memory controller, the additional memory controller maintaining an additional token bucket, the memory controller and the additional memory controller exchanging tokens to manage write operations in the memory array and the additional memory array. The memory controller and the additional memory controller may exchange tokens through a central controller, or may exchange tokens directly, without an intermediate controller. The memory array may be a NAND memory array. The memory array may include a plurality of multi level cells. The memory card may include a host interface according to a memory card standard, and at least one parameter of the token bucket may be determined by the memory card standard.

DETAILED DESCRIPTION OF ILLUSTRATED EMBODIMENTS

Figure 1:
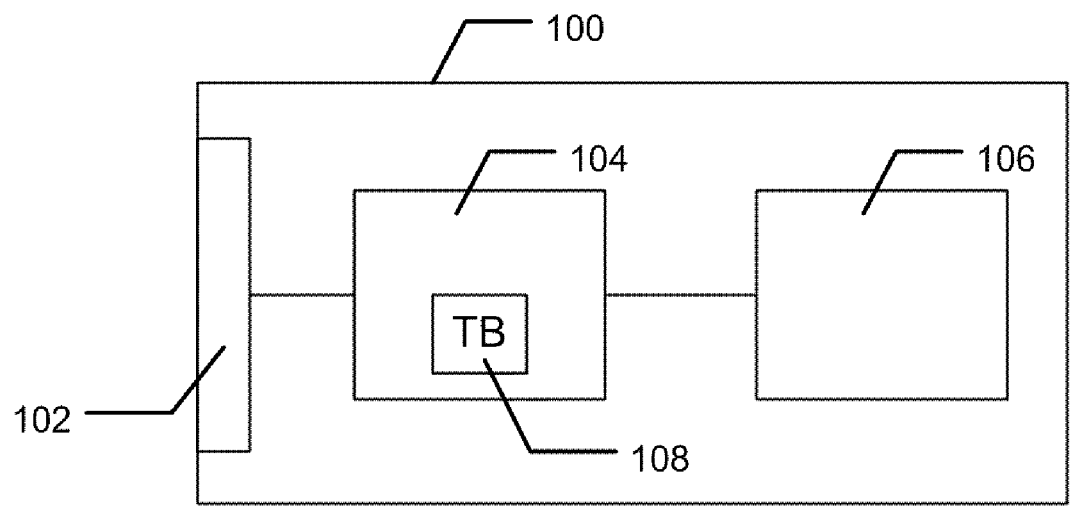
FIG. 1 shows a memory system with a single memory die and a memory controller.

FIG. 1 shows an example of memory system 100 according to an embodiment of the present invention. The memory system includes a host interface 102, a memory controller 104, and a memory array 106. These components are generally arranged in an outer casing that provides protection from physical damage. Additional components (such as light emitting diodes, LEDs) may also be provided for additional functionality.

In some examples, the host interface 102 complies with a standard (such as a memory card standard or the USB standard) so that the memory system can interface with a wide range of hosts that have a corresponding interface. Typically, such standards provide for the physical arrangement of pins in the physical interface as well as the assignment of each pin, voltage levels used, as well as the protocols used for data and commands sent through the interface. Many interfaces include a provision for a host to provide power to a memory system. For example, memory cards and USB flash drives generally obtain their power from a host through such a host interface.

The memory system 100 also includes a nonvolatile memory array 106. This may be a NAND flash memory array. Alternatively, the nonvolatile memory array may be one-time-programmable (OTP) memory, NOR flash memory, Magnetic Random Access Memory (MRAM) or other form of nonvolatile memory. The nonvolatile memory array 106 may be located on a single chip as shown. Read and write circuits and other peripheral circuits may be on the same chip.

A memory controller 104 is interposed between the host interface 102 and the nonvolatile memory array 106. The memory controller 104 manages data in the memory array 106. When the host sends data, the memory controller 104 determines where the data should be stored and records the location where it is stored. In one example, the memory controller performs logical-to-physical mapping so that data received from the host with logical addresses is mapped to physical locations in the memory array 106 in a manner that is determined by the memory controller according to the available space in the memory array. Other functions such as Error Correction Code (ECC) functions may be performed by the memory controller 104. Such ECC functions allow errors in data that is read from the memory array 106 to be corrected in the memory controller 104 before the data is sent to the host.

The rate at which the memory system 100 uses power is largely determined by the rate at which read, write, and erase operations are performed. The memory controller 104 manages these functions and thus determines the rate of power use. While various mechanisms may be used to control power use, the memory system of FIG. 1 uses a token bucket 108 in the memory controller 104 to perform such control. The token bucket 108 may be implemented by dedicated hardware formed as part of the memory controller 104 (which may be an Application Specific Integrated Circuit, or ASIC), implemented through software or firmware in the memory controller, or implemented through a combination of hardware and software. In one arrangement, the token bucket is implemented as a counter with firmware that initiates the counter to an initial value and maintains the value in the counter according to a token bucket scheme.

Figure 2:
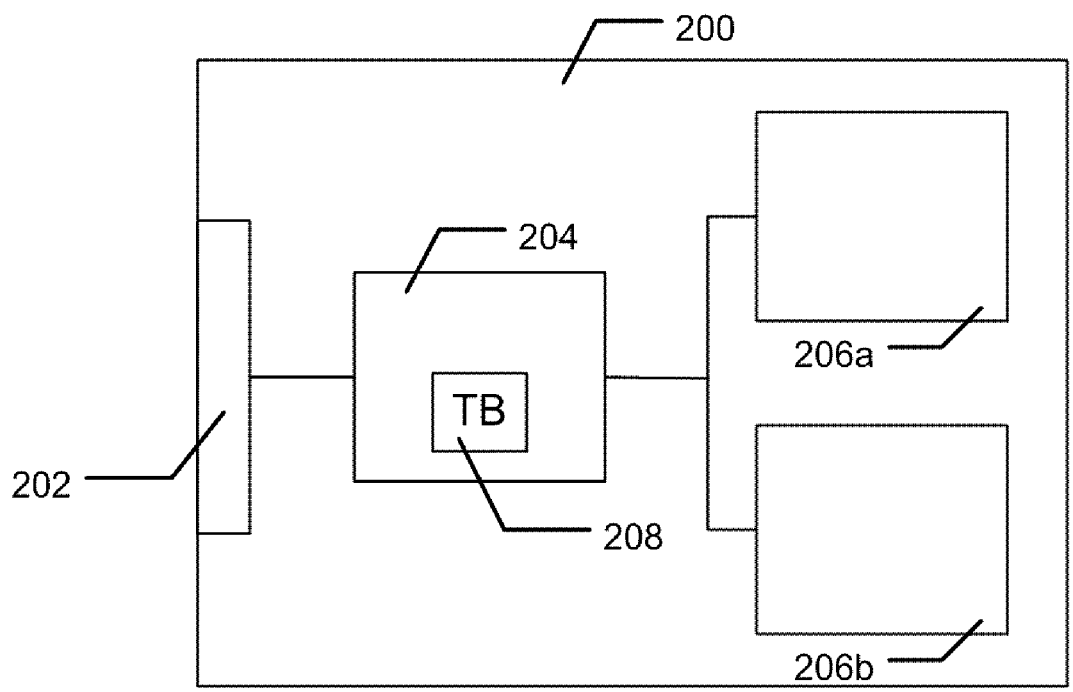
FIG. 2 shows a memory system with two memory dies and a memory controller.

FIG. 2 shows a memory system 200 according to an alternative example. In this example, a memory controller 204 manages data in two separate memory dies 206a, 206b. The two dies may be on two physically separate chips, or may be on the same chip (i.e. on the same piece of Silicon). Arrangements such as that shown in FIG. 2 are common ways to provide increased capacity in a memory system in a reasonably cheap manner (e.g. using two 1 GigaByte chips instead of one 2 GigaByte chip). Such an arrangement may also allow some parallel operation, where the controller communicates with one die while the other die is occupied executing a command. However, such parallel operation may cause power consumption problems if the two memory dies both require significant power at the same time (e.g. if both perform write operations in parallel). Thus, power management is a particularly important issue in such arrangements and parallel operation requires special attention. A token bucket 208 is used in the memory controller 204 to manage power consumption in the two memory dies 206a, 206b.

Figure 3:
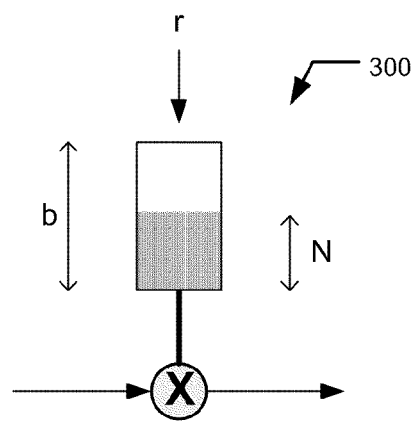
FIG. 3 illustrates the operation of a token bucket.

FIG. 3 illustrates the operation of a token bucket 300 that may be used in examples of the present invention. The operation of a token bucket is analogous to a bucket that is filled to a particular level N at any given time (where N is the number of tokens in the bucket), the bucket having a maximum capacity b (maximum number of tokens that bucket can contain). Before a power-consuming operation is performed, the token bucket 300 is checked to see if enough tokens are available to perform the operation. Thus, when the host sends a write command and some data to be written, the memory controller determines the individual write operations involved and for each write operation the controller checks the token bucket before the data is written in the memory array. In this way, operation of the memory system may stay within specified limits.

Power consumption limits may be set in a number of ways. The size of the token bucket b represents the largest amount of current that may be consumed in a burst. In one example, where it is desirable to program four upper pages in parallel, and each page programming operation uses 5500 mA/us, the maximum power is 22000 mA/us and b is selected accordingly. Any operation or combination of operations that would use more than b tokens is not possible in a given time period. Any such operation(s) must be carried out over more than one time period. Tokens must be added to the token bucket to replace tokens that are removed as a result of power consumption. The rate at which such tokens are added represents the maximum average power consumption. In FIG. 3, the rate at which tokens are added is represented by r. In general r depends on the host interface standard. Tokens are added at a rate r, or one token is added every 1/r seconds. In some cases it may not be possible or desirable to add one token every 1/r seconds (e.g. clock resolution is not sufficient) so instead, a number of tokens is added every S milliseconds, the number given by (r*S)/1000. If the token bucket is already full (i.e. if N=b) then any tokens to be added to the bucket are not added, but are discarded (i.e. the bucket cannot hold more than b tokens). The token bucket of FIG. 3 may be implemented as an n-bit counter with a suitable routine to initialize the bucket and add tokens as appropriate, and another routine to check the bucket prior to performing an operation and update the bucket as power is consumed.

Prior to performing a power-consuming operation, the number of tokens N in the token bucket 300 is checked to make sure that there are enough tokens. If insufficient tokens are available then the operation may be stalled. For example, when a write that requires n tokens where n is the amount of current times the duration of the operation (mA*uS), the token bucket 300 is checked to see if it contains at least n tokens. When a power-consuming operation is performed, the number of tokens in the token bucket 300 is reduced according to the power consumed. Thus, for a write operation requiring n tokens, the number is reduced by n. Similarly, for an erase operation, the number may be reduced by an amount that represents the power consumed in erasing a block or metablock (unit of erase). And for a read operation, the number may be reduced by an amount that represents the power consumed in reading a page. In some cases, writing different pages may consume different amounts of power (e.g. upper page write generally consumes more power than lower page write).

The rate r may be determined as follows.
Let a be the desired average current/time unit.
Let T be the desired averaging period.
Let b be the allowed burst size.
Then set the rate r to be:

$$r = a - \frac{b}{T}$$

For Example:
Let a be 100 mA.
Let T be 16,000 uS.
Let b be four D3 upper page programming times (4×5500 us)=22000 us.
Then set the rate r to be:

$$r = (100 \text{ ma/ms}) - \frac{(22000us)}{16,000us} = 98.63 \text{ mA}/us$$

Figure 4:
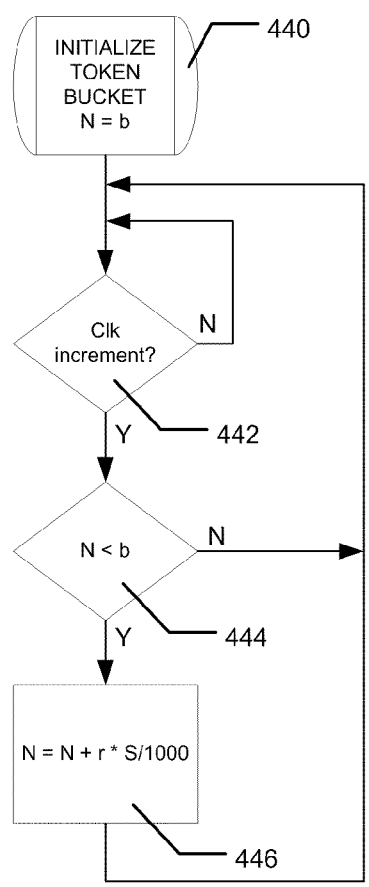
FIG. 4 shows an algorithm for adding tokens to a token bucket.

FIG. 4 shows a routine for initializing a token bucket and adding tokens to the token bucket during operation. The token bucket is initialized 440 with the number of tokens in the bucket N set to the maximum number of tokens b. The routine then waits for a clock cycle 442 and checks to see if the token bucket is full (if N=b) 444. If it is still full, then the routine returns to wait for the next clock cycle 442 without adding any tokens. If the token bucket is not full then the number of tokens in the token bucket is increased by (r*S)/1000 446. Then the routine returns to wait for the next clock cycle 442. The routine of FIG. 4 may be implemented in firmware using an interrupt routine or it may be provided as a timer/counter in hardware for high precision timing.

Figure 5:
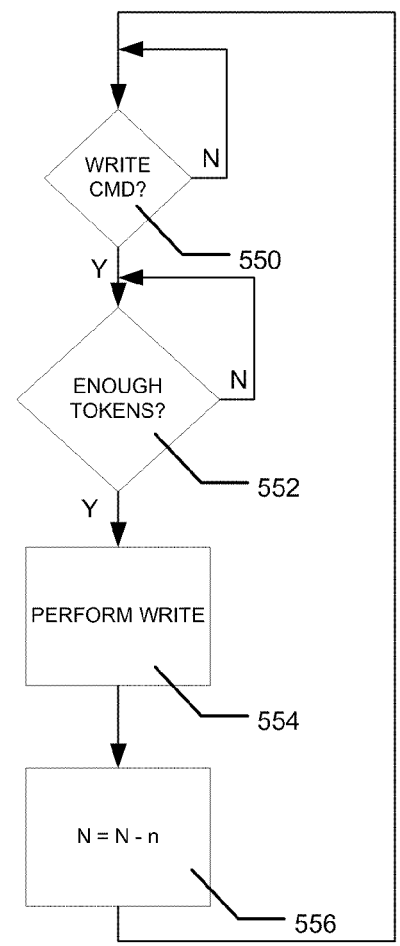
FIG. 5 shows a memory write operation using a token bucket.

FIG. 5 shows a routine for performing write operations using a token bucket. The routine waits for a write command to be received from a host 550. Then, the routine checks to see if there are enough tokens in the token bucket to carry out a write operation 552. If there are not enough tokens then the routine stalls until enough tokens are present in the token bucket (more tokens are added at each clock cycle). Then the write operation is performed 554. The number of tokens in the token bucket is then reduced 556 by a number n that represents the power consumed in the write operation. The routine then returns to wait for another write command 550. It should be noted that FIG. 5 shows the number of tokens being reduced 556 after the write is performed 554, but the order of these steps is not critical. The number of tokens may alternatively be updated before the write operation, or during the write operation.

In addition to determining whether a particular write operation may be performed or not, a token bucket may also be used to determine a degree of parallelism to use in performing multiple operations. In various memory systems, operations can be performed sequentially or with some overlap that provides increased speed. However, such parallel operations may cause power consumption limits to be exceeded if they are not managed adequately. Aspects of the present invention relate to such management of parallel operations so that power consumption limits are not exceeded.

Figure 6:
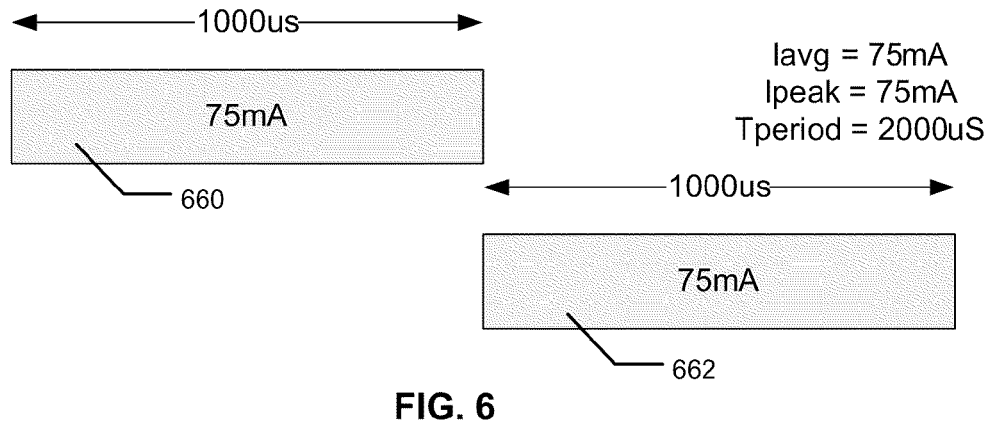
FIG. 6 shows an example of write operations that are executed in series, without overlap.

FIG. 6 shows an example of two write operations 660, 662 being performed in series in a dual-die memory array. Each write operation 660, 662 takes 1000 uS, so that the two operations take 2000 uS. The current used in each write operation is the same and is constant throughout the write operation at 75 mA. Thus, the average current (Iavg) and the peak current (Ipeak) are both the same (75 mA). While the example of FIG. 6 provides low average current use and low peak current, the time (2000 uS) may be undesirably long.

Figure 7:
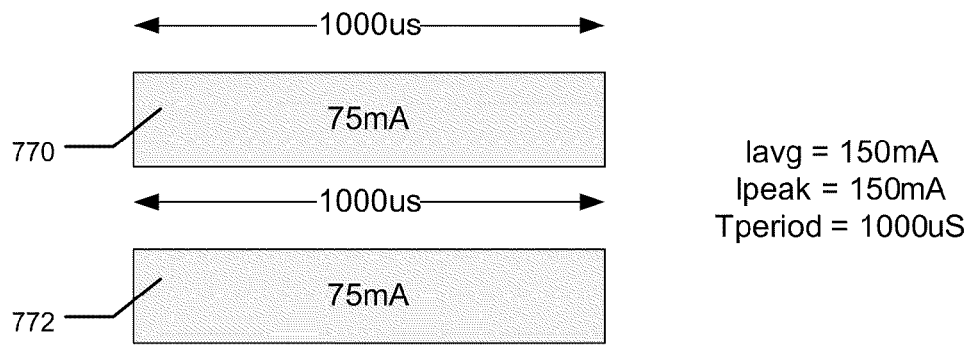
FIG. 7 shows an example of write operations that are executed in parallel, completely overlapping.

FIG. 7 shows an alternative example for performing two write operations 770, 772 in a dual-die memory array. In FIG. 7, both write operations 770, 772 are performed in parallel and thus the two write operations are completed in 1000 uS (half the time taken in the example of FIG. 6). However, the current used (both average current and peak current) is twice as much as the previous example (150 mA). While faster operation is generally desirable, such increased current consumption may exceed a predetermined limit.

Figure 8:
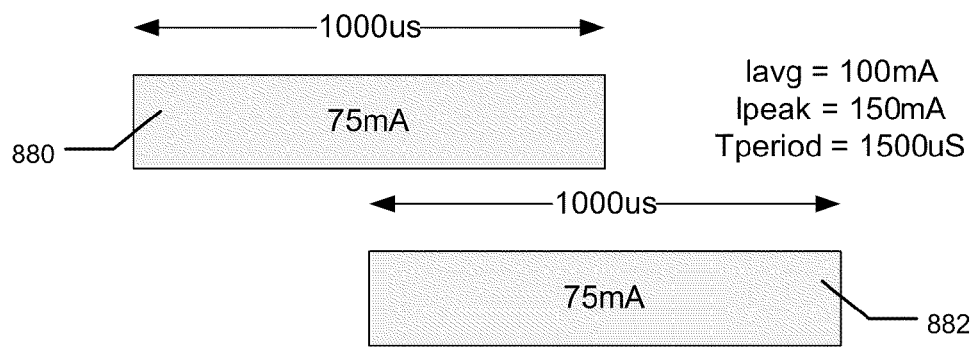
FIG. 8 shows an example of write operations that are partially executed in parallel, with some overlap.

FIG. 8 shows an alternative example in which two write operations 880, 882 in a dual-die memory array are partially performed in parallel (partially overlapping write operations). In this example, the write operations overlap for half of the time for a write operation (i.e. they overlap for 500 uS). Thus, the two write operations take a total of 1500 uS. While not as fast as entirely parallel operation (as shown in FIG. 7), this is significantly faster than entirely serial operation (as shown in FIG. 6). While the peak current used (Ipeak) is the same as in FIG. 7 (150 mA), the average current (Iavg) is reduced (100 mA). Such partially parallel operation allows the tradeoff between speed and power to be managed in a precise manner so that speed may be maximized for any given power limit.

In one example (SD SpeedClass 4) a test is performed using a 20 MHz SecureDigital (SD) bus with a 100 mA average current limit. During the test, the memory array (e.g. NAND flash memory array) may be idle for 80% of the time while waiting for data transfers. It is assumed that SD bus transfer takes 80 time units and programming in the memory array takes 20 time units. Each memory die consumes 50 mA during programming, and the controller consumes 20 mA. By enabling dual die interleave for a short burst, performance may be increased by a factor of 1.8, but current consumption spikes at 130 mA during the burst. However, because current is averaged over 100 time units, and the memory array is only active 20% of the time, the average current consumption is (80*30 mA+20*130 mA)/100=50 mA. This result is within the average current limit.

Partially parallel operations such as those of FIG. 8 may be managed using a token bucket. For example, when a memory controller has two write operations to perform, the memory controller may first check to see if there are enough tokens to perform one write operation. If there are enough for one, then the memory controller performs the first write. The memory controller may also see if there are additional tokens in the token bucket that would allow another write operation to be performed in parallel. If there are additional tokens, then the second write operation may be performed at least partially in parallel with the first write operation. The number of additional tokens in the token bucket may determine the degree of parallelism (amount of overlap) used.

Figure 9:
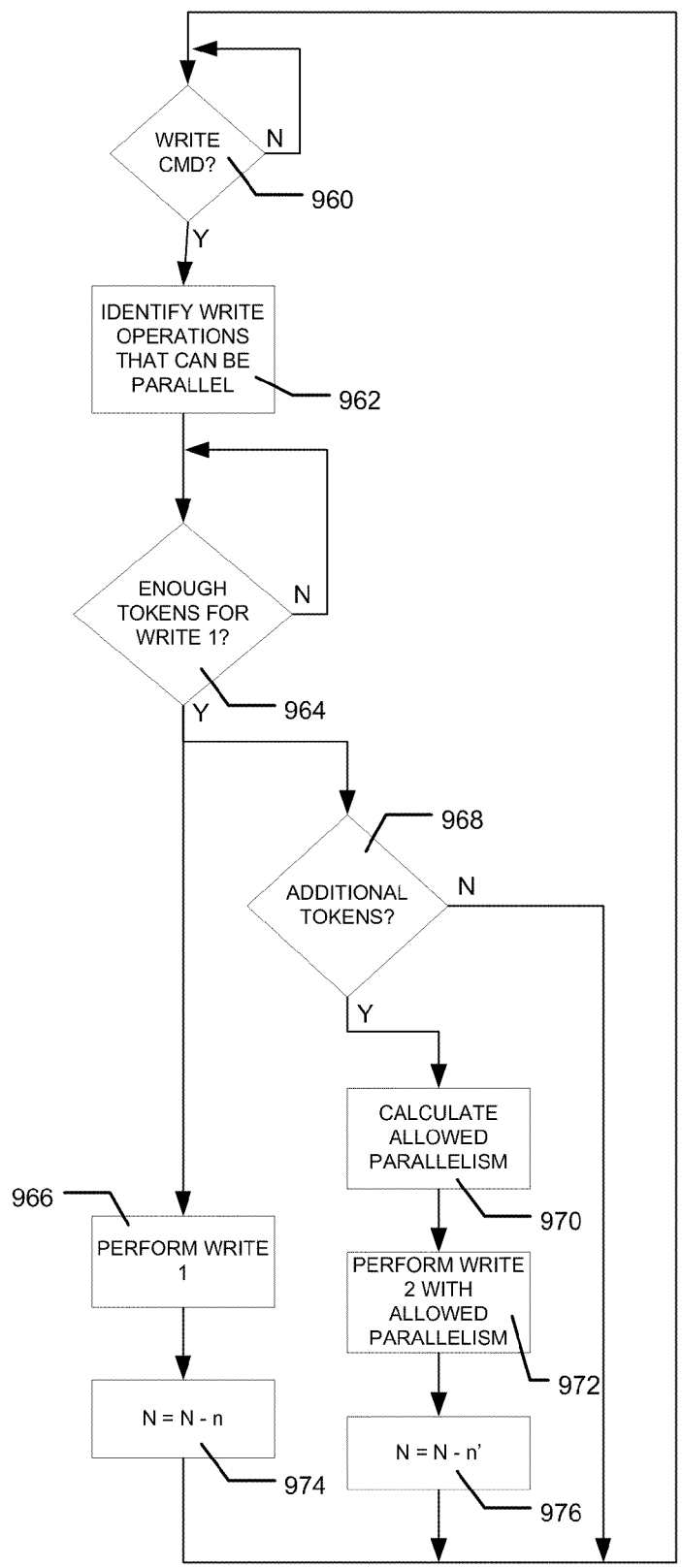
FIG. 9 shows how two or more memory write operations may be managed using a token bucket.

FIG. 9 is a flowchart showing a scheme by which a memory controller manages parallel write operations within predetermined power limits. Initially the memory controller waits for a write command 960. When a write command is received, the memory controller determines how the data will be stored in the memory array and identifies any individual write operations that may be performed in parallel 962. For example, the memory controller may determine that the write command concerns data that will fill two pages in the memory array and the memory controller may identify available pages in two different dies so that pages in the two dies may be written in parallel. The memory controller then verifies that there are enough tokens for at least the first write operation (write 1) 964, which in this example would be writing the first page. If there are insufficient tokens for the first write operation, then the process stalls while waiting for additional tokens. If there are enough tokens for the first write operation, then the first write operation is performed 966. The memory controller also checks to see if there are additional tokens available 968 (more tokens than those needed for the first write operation). If there are additional tokens available then the memory controller calculates the degree of parallelism that the additional tokens allow 970. For example, the additional tokens may allow the second write operation to be performed entirely in parallel with the first write operation (100% overlap), or with some lesser degree of parallelism (e.g. 50%). The second write operation (write 2) is then performed in parallel with the first write operation with the allowed degree of parallelism 972. When the first write operation is completed, the number of tokens in the token bucket is reduced by a number n that reflects the amount of power used in the first write operation 974. When the second write operation (or allowed portion of the second write operation) is performed, the token bucket is reduced by a number n' that reflects the amount of power used in the second write operation 976. Write operations may be carried out with maximum allowable parallelism so that the token bucket is emptied after first and second write operations are performed.

While the above example refers to writing two pages in parallel, the invention is not limited to any particular number of pages and may be applied to systems in which more than two pages are written in parallel. Such pages may be located in more than two dies, and such dies may be on different chips. Furthermore, while the above example refers to a single memory controller that operates a token bucket and performs all data management functions for a memory array, other implementations are also possible.

Figure 10:
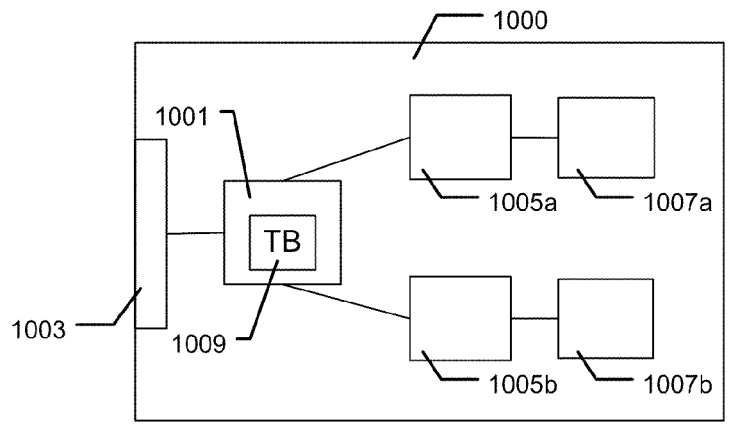
FIG. 10 shows a memory system with a central memory controller that includes a token bucket.

FIG. 10 shows an arrangement in which a memory system 1000 includes a central controller 1001 that is connected to a host interface 1003. In addition to the central controller 1001, there are two peripheral controllers 1005*a*, 1005*b* each of which is connected to a memory chip 1007*a*, 1007*b* (in other examples, each peripheral controller may be connected to two or more memory chips). The central controller 1001 includes a token bucket 1009 and the central controller 1001 manages parallel operations in the memory chips 1007*a*, 1007*b* so that the overall power consumption of the memory system 1000 is maintained within predetermined limits. While other aspects of data storage may be managed by peripheral memory controllers 1005*a*, 1005*b* (e.g. ECC, garbage collection) the peripheral memory controllers do not contain token buckets and do not determine when parallel operation is permitted in this example.

Figure 11:
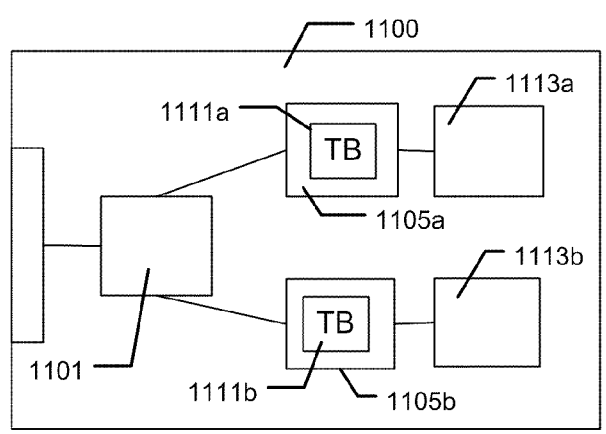
FIG. 11 shows a memory system with a central memory controller and two peripheral controllers that each includes a token bucket.

FIG. 11 shows an alternative arrangement of a memory system 1100 in which two peripheral memory controllers 1105*a*, 1105*b* each contains a token bucket 1111*a*, 1111*b*. The peripheral memory controllers 1105*a*, 1105*b* separately determine whether they can proceed to perform any given operation (in respective memory chips 1113*a*, 1113*b*) based on the level of tokens in their own token bucket. Some communication may occur between the two peripheral memory controllers through the central memory controller 1101. For example, information regarding the levels of tokens in each of the token buckets 1111*a*, 1111*b* may be communicated. In some cases, one peripheral memory controller may send tokens to the other memory controller. In this way, the overall power consumption may be kept within predetermined limits while allowing flexibility in where power is consumed within the memory system.

Figure 12:
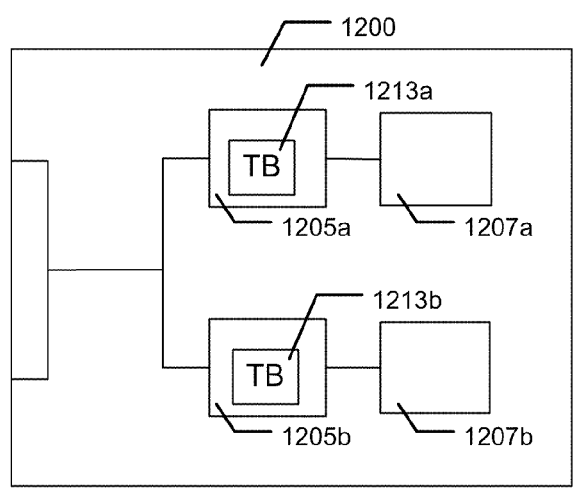
FIG. 12 shows a memory system with two memory controllers that each includes a token bucket.

FIG. 12 shows an alternative arrangement in which no central controller is provided in a memory system 1200. Two memory controllers 1205*a*, 1205*b* are provided, each managing data in a memory chip 1207*a*, 1207*b*. Each memory controller includes a token bucket 1213*a*, 1213*b*. Memory controllers may exchange information regarding token buckets directly. In some cases, memory controllers may transfer token buckets between them so that a memory controller that has more tokens than it needs may transfer the tokens to a memory controller that needs them.

While the above examples show two memory chips that may be operated in parallel, more than two memory chips, with more than two peripheral memory controllers may also be used. A single central memory controller may serve more than two such peripheral memory controllers. Alternatively, more than two memory controllers may directly communicate and exchange tokens without any central controller.

While many of the above examples refer to write operations that are initiated by a host write command, it will be understood that aspects of the present invention may apply to other operations also. Such operations may include write operations that are not directly initiated by a host write command, such as write operations that occur as part of garbage collection, or directory writes. Such operations may also include erase operations, read operations, and various operations performed within a memory controller such as ECC operations.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of managing a memory system comprising:
   maintaining, by a memory controller, a variable credit value in the memory controller, the variable credit value indicating an amount of power currently available for memory operations in the memory system, the variable credit value having an upper limit that reflects a maximum power limit for the memory system;
   receiving a command to perform a memory operation;
   prior to performing the memory operation, checking that the variable credit value indicates that there is sufficient power available to perform the memory operation; and
   updating the variable credit value to reflect the power used in performing the memory operation.

2. The method of claim 1 further comprising checking if the variable credit value indicates that there is sufficient power available to perform at least a part of an additional memory operation, and if there is sufficient power to perform at least a part of an additional memory operation, then determining a degree of parallelism to use in performing the memory operation and the additional memory operation.

3. The method of claim 2 wherein the memory operation is programming a first page in a first memory die and the additional memory operation is programming a second page in a second memory die.

4. The method of claim 3 wherein the first die is on a first memory chip and the second die is on a second memory chip.

5. The method of claim 3 wherein the first page is a lower page and the second page is an upper page.

6. The method of claim 1 wherein the variable credit value is maintained as a number of tokens in a token bucket, with tokens periodically added to the token bucket to increase the number of tokens up to a maximum number.

7. The method of claim 6 wherein the tokens are added at a rate that depends on a power mode of a host device.

8. The method of claim 6 wherein the token bucket is provided as an n-bit counter.

9. The method of claim 6 wherein the maximum number is determined by a maximum power available to the memory system through an interface.

10. The method of claim 1 wherein the variable credit value is maintained as a number of tokens in a token bucket, with tokens added to the token bucket in bursts.

11. A method of managing a memory system comprising:
    maintaining a variable credit value in a memory controller, the variable credit value reflecting an amount of power available for memory operations in the memory system, the variable credit value having an upper limit that reflects a maximum power limit for the memory system;
    prior to performing a memory operation, checking that the variable credit value indicates that there is sufficient power available to perform the memory operation; and
    updating the variable credit value to reflect the power used in performing the memory operation;
    wherein:
    the variable credit value is maintained as a number of tokens in a token bucket, with tokens periodically added to the token bucket to increase the number of tokens up to a maximum number;
    the tokens are added at a rate that depends on a power mode of a host device; and
    the tokens are added at a lower rate when the host device is operating on battery power, and the tokens are added at a higher rate when the host device is operating on external power.

12. A memory system comprising:
    one or more non-volatile memory arrays; and
    a memory controller that manages data transfer to and from the memory arrays, the memory controller being configured to:
    maintain a variable credit value, the variable credit value indicating an amount of power currently available for memory operations in the memory system, the variable credit value having an upper limit that reflects a maximum power limit for the memory system;
    receive a command from a host to perform a memory operation;
    prior to performing the memory operation, check that the variable credit value indicates that there is sufficient power available to perform the memory operation; and
    update the variable credit value to reflect the power used in performing the memory operation.

13. The memory system of claim 12, wherein the memory controller is further configured to check whether the variable credit value indicates that there is sufficient power available to perform at least a part of an additional memory operation, and when there is sufficient power to perform at least a part of an additional memory operation, then determine a degree of parallelism to use in performing the memory operation and the additional memory operation.

14. The memory system of claim 13 wherein the memory operation is programming a first page in a first memory die and the additional memory operation is programming a second page in a second memory die.

15. The memory system of claim 14 wherein the first die is on a first memory chip and the second die is on a second memory chip.

16. The memory system of claim 14 wherein the first page is a lower page and the second page is an upper page.

17. The memory system of claim 12 wherein the variable credit value is maintained as a number of tokens in a token bucket, with tokens periodically added to the token bucket to increase the number of tokens up to a maximum number.

18. The memory system of claim 17 wherein the tokens are added at a rate that depends on a power mode of a host device.

19. The memory system of claim 18 wherein the tokens are added at a lower rate when the host device is operating on battery power, and the tokens are added at a higher rate when the host device is operating on external power.

20. The memory system of claim 17 wherein the token bucket is provided as an n-bit counter.

21. The memory system of claim 17 wherein the maximum number is determined by a maximum power available to the memory system through an interface.

22. The memory system of claim 12 wherein the variable credit value is maintained as a number of tokens in a token bucket, with tokens added to the token bucket in bursts.

* * * * *